(12) United States Patent
McDonnell et al.

(10) Patent No.: US 7,881,890 B2
(45) Date of Patent: Feb. 1, 2011

(54) METHOD OF PRIORITIZING ANOMALIES IN A BURIED LINEAR CONDUCTOR

(75) Inventors: Shamus McDonnell, Edmonton (CA); Mike Westman, Edmonton (CA); Chijioke Ukiwe, Edmonton (CA)

(73) Assignee: Spectrum External Line Inspection Technology Inc., Edmonton (CA)

( * ) Notice: Subject to any disclaimer, the term of this patent is extended or adjusted under 35 U.S.C. 154(b) by 122 days.

(21) Appl. No.: 12/435,484

(22) Filed: May 5, 2009

(65) Prior Publication Data

US 2009/0281746 A1 Nov. 12, 2009

Related U.S. Application Data

(60) Provisional application No. 61/050,727, filed on May 6, 2008.

(51) Int. Cl.
*G06F 19/00* (2006.01)
(52) U.S. Cl. .......................... 702/64; 702/150; 324/539; 324/529; 324/542; 324/520; 73/865.8
(58) Field of Classification Search .............. 702/64, 702/150; 324/515, 71.1, 700, 539, 716, 718, 324/542, 543, 529, 327, 520, 521, 551, 528, 324/530, 326, 66, 67; 73/865.8, 809, 799
See application file for complete search history.

(56) References Cited

U.S. PATENT DOCUMENTS 5,270,661 A * 12/1993 Burnett ...................... 324/527

| | | | |
|---|---|---|---|
| 5,600,248 A * | 2/1997 | Westrom et al. | ........... 324/522 |
| 5,714,885 A * | 2/1998 | Lulham | ...................... 324/529 |
| 5,828,219 A | 10/1998 | Hanlon et al. | |
| 6,243,657 B1 * | 6/2001 | Tuck et al. | .................. 702/150 |
| 6,530,263 B1 * | 3/2003 | Chana | ..................... 73/40.5 R |
| 6,819,115 B1 * | 11/2004 | Keefe | .......................... 324/527 |
| 6,954,071 B2 | 10/2005 | Flatt et al. | |
| 7,400,150 B2 * | 7/2008 | Cannon | ...................... 324/522 |
| 7,439,747 B2 * | 10/2008 | Beeman | ...................... 324/528 |
| 2006/0262466 A1 * | 11/2006 | Engel | .......................... 361/42 |
| 2007/0265809 A1 | 11/2007 | McDonnell et al. | |
| 2008/0157780 A1 * | 7/2008 | Beeman | ...................... 324/529 |

FOREIGN PATENT DOCUMENTS

WO WO 88/09498 12/1988
WO WO 2004/097460 11/2004

* cited by examiner

*Primary Examiner*—Carol S Tsai
(74) *Attorney, Agent, or Firm*—Davis & Bujold, P.L.L.C.

(57) ABSTRACT

A method of prioritizing anomalies in a linear conductor buried under a ground surface includes the steps of obtaining prioritization values for a plurality of anomalies along a linear conductor, and ranking the prioritization values according to magnitude. For each anomaly, a prioritization value is obtained by: locating an anomaly; for each anomaly, determining a current, a depth of cover, and a voltage gradient using spaced voltage probes; using the depth of cover and the voltage gradient, calculating an effective probe spacing of the first and second voltage probes relative to the anomaly on the conductor; and determining the prioritization value of the anomaly based on a linear relationship between the voltage gradient and the product of the current and the effective probe spacing.

5 Claims, 6 Drawing Sheets

US 7,881,890 B2

METHOD OF PRIORITIZING ANOMALIES IN A BURIED LINEAR CONDUCTOR

FIELD

Prioritizing anomalies in buried linear conductors

BACKGROUND

Cables used for transmission of data or electricity and pipelines used in transporting liquids, gases and other fluid media are mostly buried underneath the soil, and are therefore subject to corrosion. To prevent the possibility of accidents due to spillage of the media being transported, the cables and pipelines are usually coated with an insulating barrier that separates them from the corrosive effects of the soil. However, over time, these insulating coatings wear out and certain portions of the cable or pipeline become exposed to the soil. The exposed parts of the cables or pipelines, where direct contact with the surrounding soil is established, are called "anomalies" or "holidays".

Several methods of pipeline integrity and corrosion mitigation are currently available for monitoring the state of the buried pipelines. They include close interval potential survey (CIPS), direct current voltage gradient (DCVG), alternating current voltage gradient (ACVG), and alternating current—current attenuation (ACCA). The use of these methods for the indirect assessment of the state of the underground structure functions is done primarily by determining the change in certain parameters along the length of the structure. When these parameters exceed certain magnitudes, the presence of a coating holiday, or coating anomaly, is suspect.

SUMMARY

There is provided a method for the prioritization of coating anomalies along a pipeline via voltage gradient measurements along the axis of the pipeline.

According to an aspect, a method of prioritizing anomalies in a linear conductor buried under a ground surface comprises the steps of: obtaining prioritization values for a plurality of anomalies along a linear conductor, and ranking the prioritization values according to magnitude. Each voltage gradient prioritization value is obtained using the probe spacing of the voltage probes, depth of burial or depth of cover (DOC) of the pipeline, and electrical current level at the point of measurements. The method eliminates the need to maintain common probe spacing for all points being surveyed, insofar as the probe spacing is known at each point. Each prioritization value is obtained using the effective probe spacing (which is a function of the nominal probe spacing between the voltage probes and the depth of cover), the electrical current, and the voltage gradient at each point.

According to an aspect, there is provided a methodology for the determination of the voltage gradients under abnormal conditions where it is difficult, or too dangerous, to assess the top of the pipeline. Under such conditions, the pipeline probe is moved to an off-set distance from the pipeline axial direction, and the second probe is moved even further perpendicular or parallel but some distance away. Two voltage gradients data are collected in this case and corrections are made for the off-set distance, and for probe spacing, current, and depth of cover.

According to an aspect, there is provided a methodology for adjusting the probe spacing to increase voltage gradient sensitivity for situations where the pipeline is buried "too deep" in the soil.

According to an aspect, there is provided a method of prioritizing anomalies in a linear conductor buried under a ground surface, comprising the steps of obtaining prioritization values for a plurality of anomalies along a linear conductor, and ranking the prioritization values according to magnitude. For each anomaly, a prioritization value is obtained using a method comprising the steps of: locating an anomaly; determining a current along the linear conductor at the anomaly, a depth of cover of the linear conductor, and a voltage gradient using a first voltage probe at a first position and a second voltage probe at a second position, the first and second voltage probes taking a voltage reading and being separated by a probe spacing; using the depth of cover and the voltage gradient, calculating an effective probe spacing of the first and second voltage probes relative to the anomaly on the conductor; and determining the prioritization value of the anomaly based on a linear relationship between the voltage gradient and the product of the current and the effective probe spacing.

BRIEF DESCRIPTION OF THE DRAWINGS

These and other features will become more apparent from the following description in which reference is made to the appended drawings, the drawings are for the purpose of illustration only and are not intended to be in any way limiting, wherein.

DETAILED DESCRIPTION

The method of prioritizing anomalies in a buried linear conductor will now be described with reference to FIG. 1 through 7(d).

The DCVG and ACVG, of which there are several variations, function by monitoring the change in the voltage gradient at any point along the pipeline with respect to either the remote soil or another part of the pipeline. While the DCVG utilizes a direct current either native to or injected onto the pipeline from the cathodic protection system, the ACVG measures voltage gradients due to alternating currents supplied to the pipeline, usually from an external AC transmitter. Voltage gradient surveys are generally conducted with two voltage probes, one directly above the pipeline at the point being tested, and the second probe either above the pipeline and some distance away (parallel survey) or orthogonal to it and some distance away from the pipeline (perpendicular survey). The relative magnitude of the measured voltage gradients is ample indication of anomaly size, and is important for the purpose of prioritizing the coating anomalies. It is also a necessary guide should there be a need to dig the ground to repair the damages on the underground structures. From the viewpoint of maintenance costs, this is a necessary process that ensures that incorrect assessments do not result in expensive excavations at pipeline locations not requiring them.

For convenience, voltage gradient measurements, whether they are DC, AC or other potential that is effectively assessed through probe to probe measurement in the vicinity of a linear conductor for the purpose of assessing the integrity of the coating on the conductor, will be referred to as ACVG in the remainder of this document. It will be understood, however, that the principles discussed apply to DC and other potentials as well. Furthermore, the principles discussed herein apply to cables, pipelines, or other underground linear conductors, and will be referred to as pipelines, linear conductor or structure.

Figure 1:
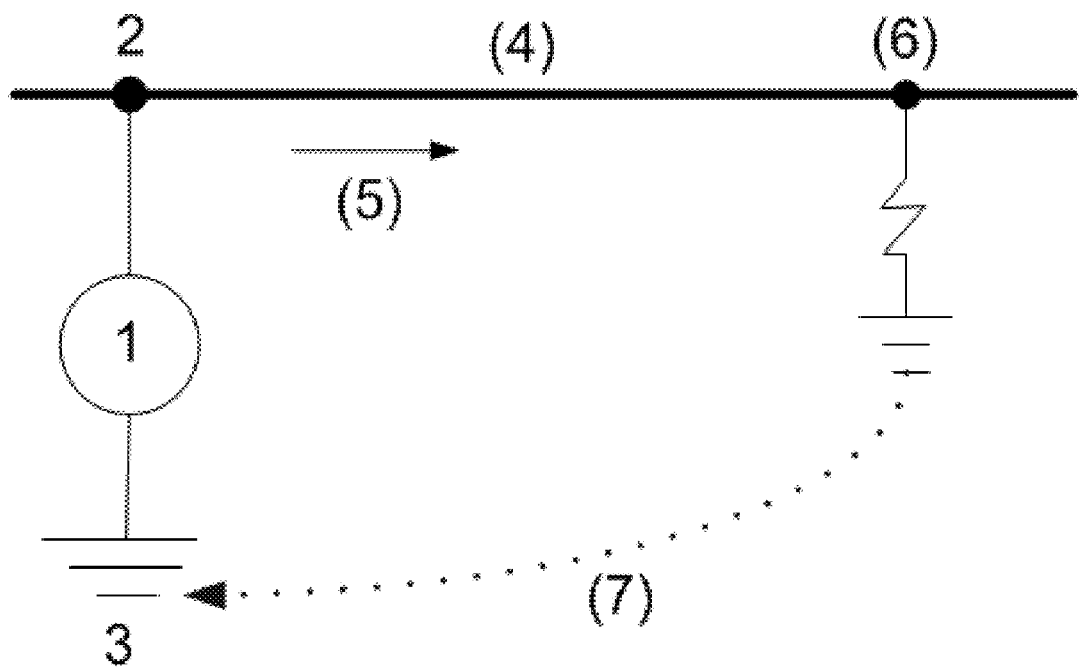
FIG. 1 is a schematic representation of a typical pipeline wherein an AC current is injected into the line for the purpose of voltage gradient measurements.

The general process of voltage gradient (VG) measurements begins with consideration of FIG. 1, which is a schematic representation of a simple pipeline system AC voltage gradient measurement technique. In FIG. 1, an AC signal from a signal generator 1 is transmitted onto the pipeline 4 via the contact point 2, and to a ground point 3 which is generally greater than 50 feet away. The AC current travels along the direction 5. The system created results in a potential difference between the pipeline and the surrounding soil. Thus, at any coating anomaly such as anomaly 6, part of the AC current leaks off the pipeline, travels along several paths such as path 7, and completes the circuit via the ground point 3. Beyond anomaly 6, the AC current is highly reduced compared to the original input at 2.

Figure 7A:
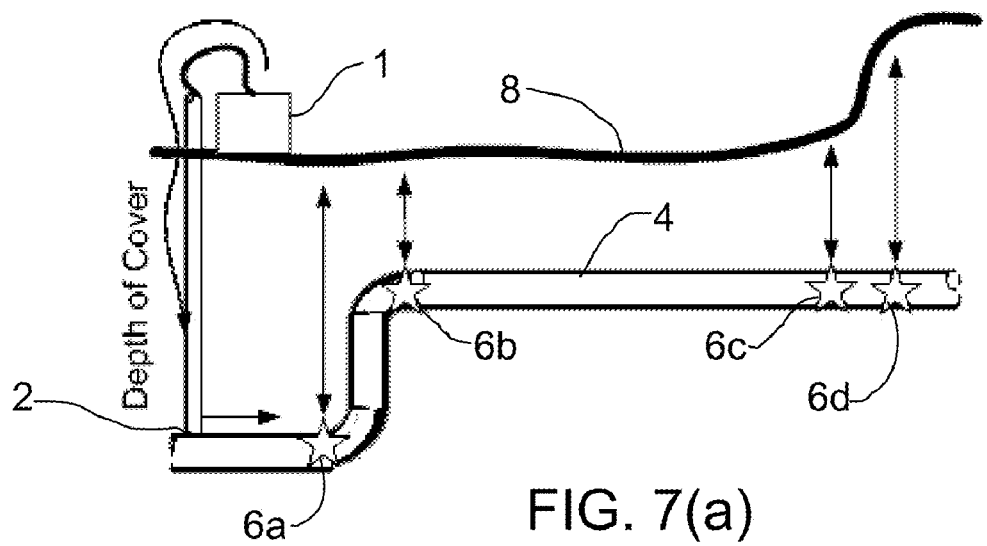
FIG. 7(a) is an example of a buried linear conductor with anomalies and a changing DOC
Figure 7B:
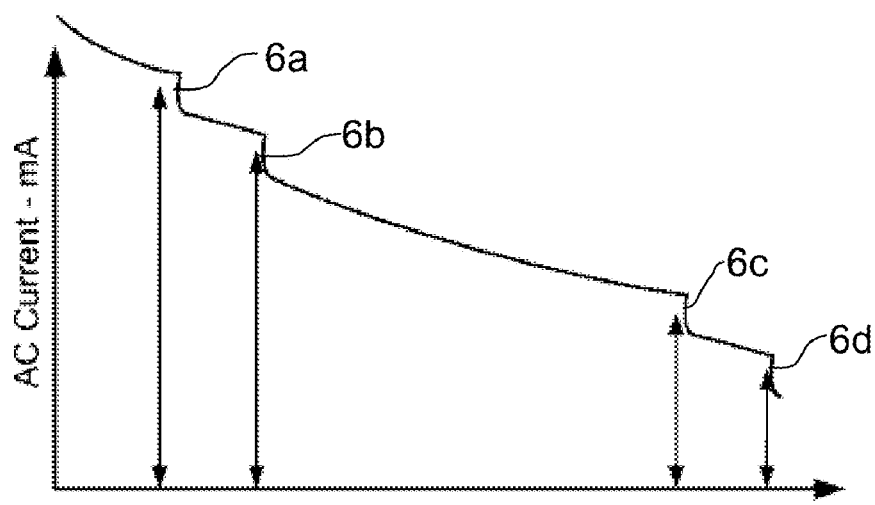
FIG. 7(b) is a graph depicting the change in current along the linear conductor
Figure 7C:
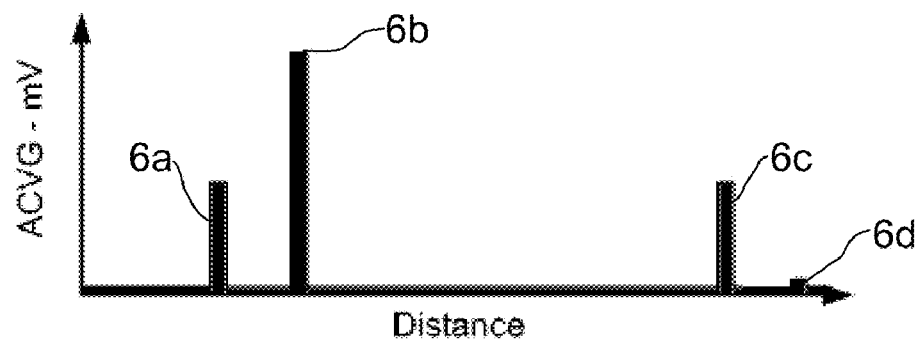
FIG. 7(c) is a graph depicting the ACVG of each linear conductor
Figure 7D:
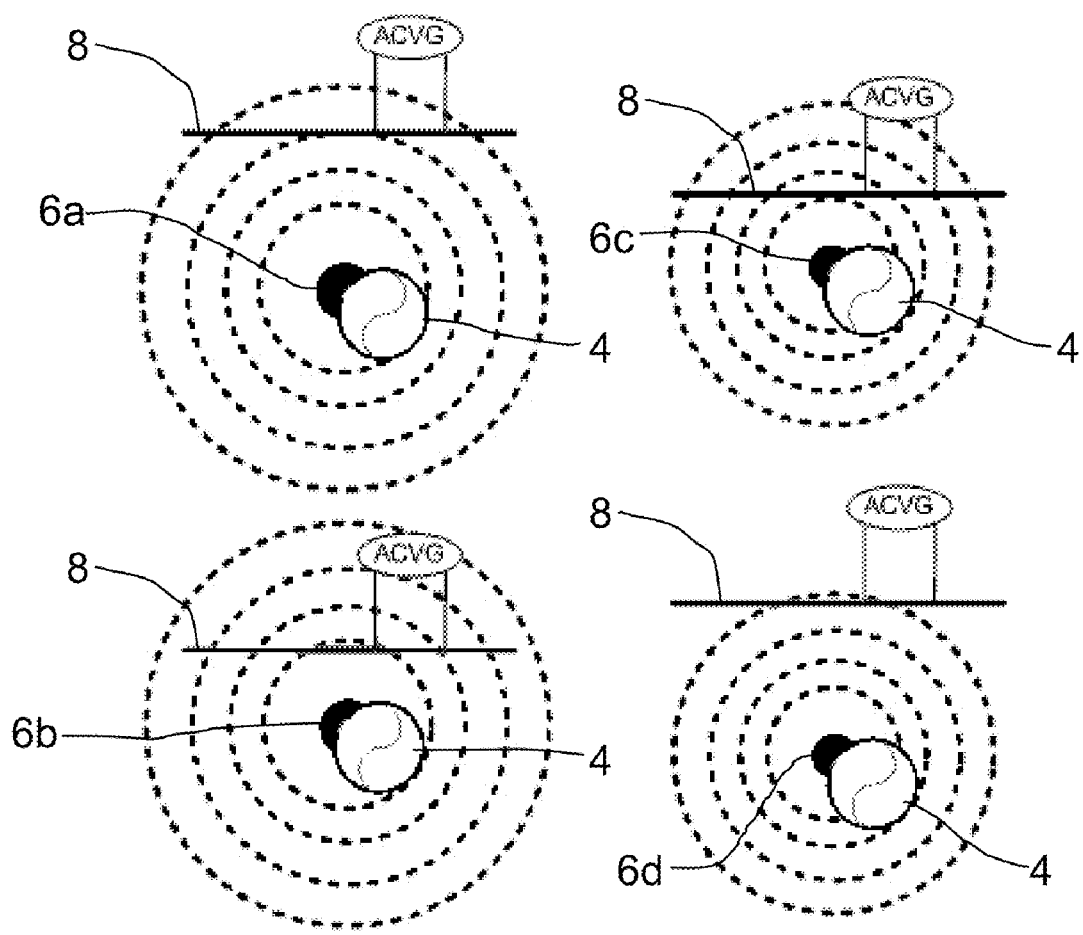
FIG. 7(d) is a series of graphs depicting the magnetic field lines for each anomaly.

Referring to FIG. 7(a), pipeline 4 is shown under a ground surface 8 under a changing depth of cover (DOC) and a series of anomalies 6a, 6b, 6c and 6d, which are, for the purposes of this example, the same size. As can be seen in FIG. 7(b), the current generated by signal generator 1 decreases gradually in value as it progresses along pipeline 4 due to leakage, and more sharply due to the anomalies 6a through 6d. FIG. 7(c) depicts the ACVG measurements obtained at the ground surface 8, based on a constant probe spacing. As can be seen, the ACVG value is affected by both the DOC, and the current. FIG. 7(d) depicts the magnetic field lines generated by the current at each anomaly 6a through 6d.

Figure 2:
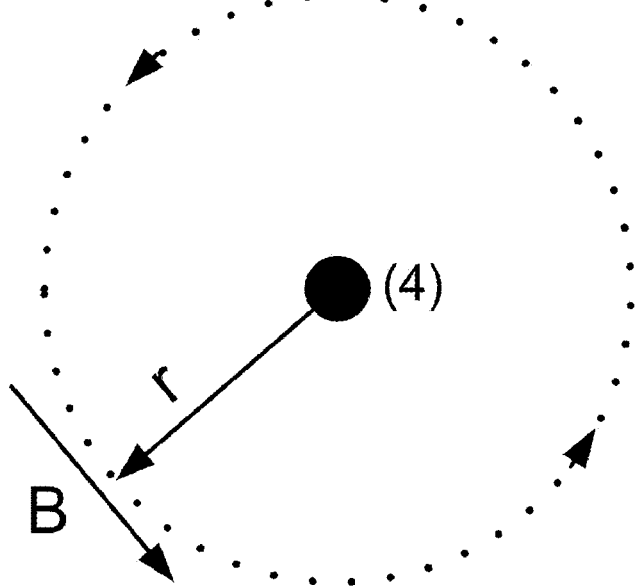
FIG. 2 is a schematic description of the relationship between magnetic field strength and electrical current at a given distance from the current source.

FIG. 2 shows the pipeline 4, perpendicular to the page, and the AC current traveling out of the page. The pipeline 4 is a typical example of a linear conductor carrying current. According to a fundamental law of physics, proposed by Ampere, there is a magnetic field associated with all current flows, and its direction is perpendicular to the axial direction of current flow, as described by the Right-hand corkscrew rule: the thumb pointing to the direction of current, and the four fingers in the direction of the magnetic field. A magnetic field can be represented by field lines that show the shape of the field. Lines close together represent a strong field and lines spaced widely apart represent a weak field. Mathematically, the magnetic field B at a distance r from the source of current 4 is given by:

$$B = \frac{\mu_0}{2\pi} \frac{I}{r} \quad (1)$$

where $\mu_0 (=4\pi*10^{-7}$ T.m/A) is magnetic permeability, I is the current in Amperes, and r is radial distance from the current source, expressed in meters. Since $\mu_0$ and $\pi$ are both constant parameters, Equation (1) can be simplified as:

$$B = k \cdot \frac{I}{r} \quad (2)$$

Figure 3:
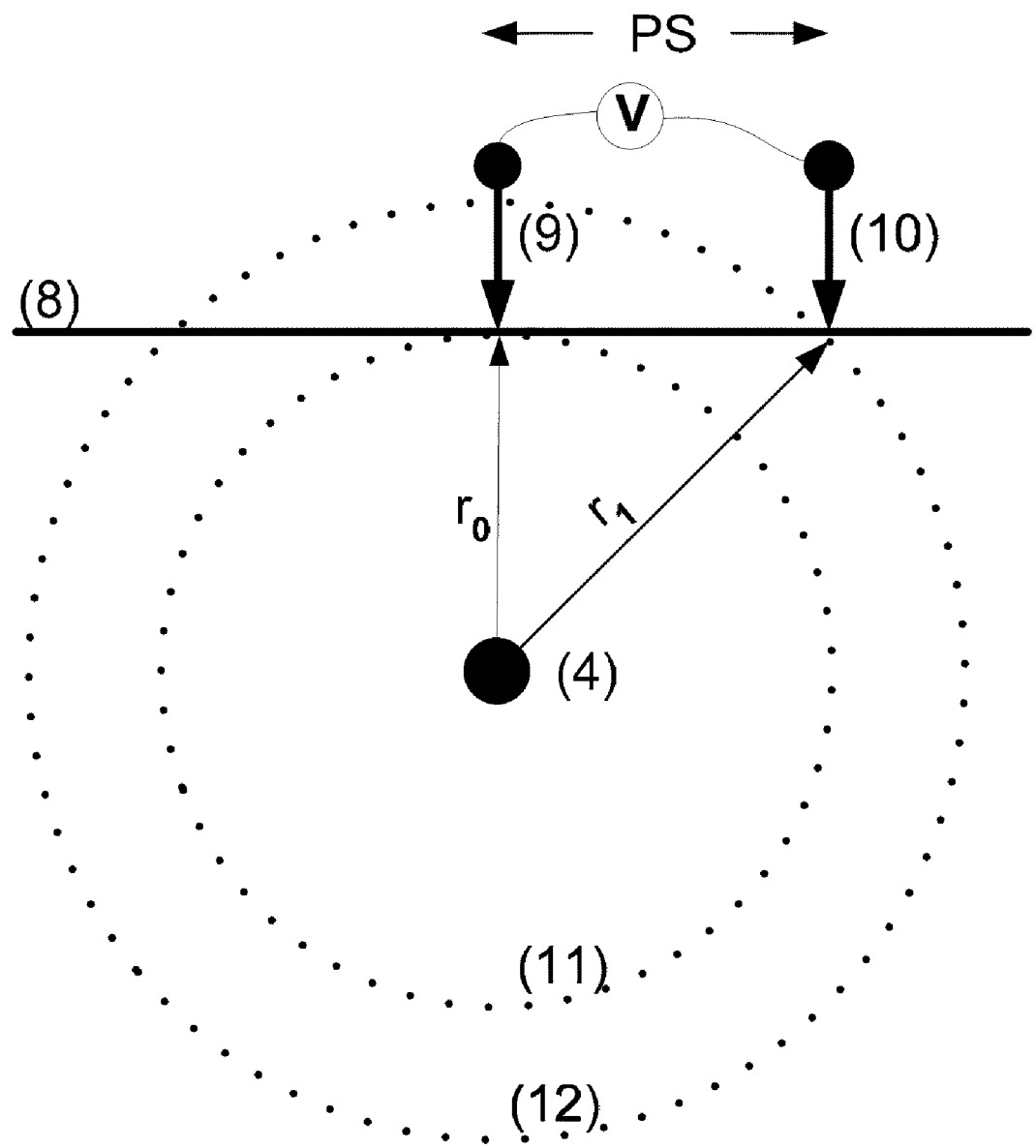
FIG. 3 is a simple illustration of conventional voltage gradient measurement technique.

With reference to FIG. 3, which is a typical field technique for acquiring voltage gradient data, the circles 11 and 12 refer to two radial distances from the source 4 of current. At any point along these radial distances, the magnetic field strengths are derivable from Equation (2) as:

$$B_0 = k \cdot \frac{I}{r_0} \text{ and } B_1 = k \cdot \frac{I}{r_1} \quad (3)$$

Figure 4A:
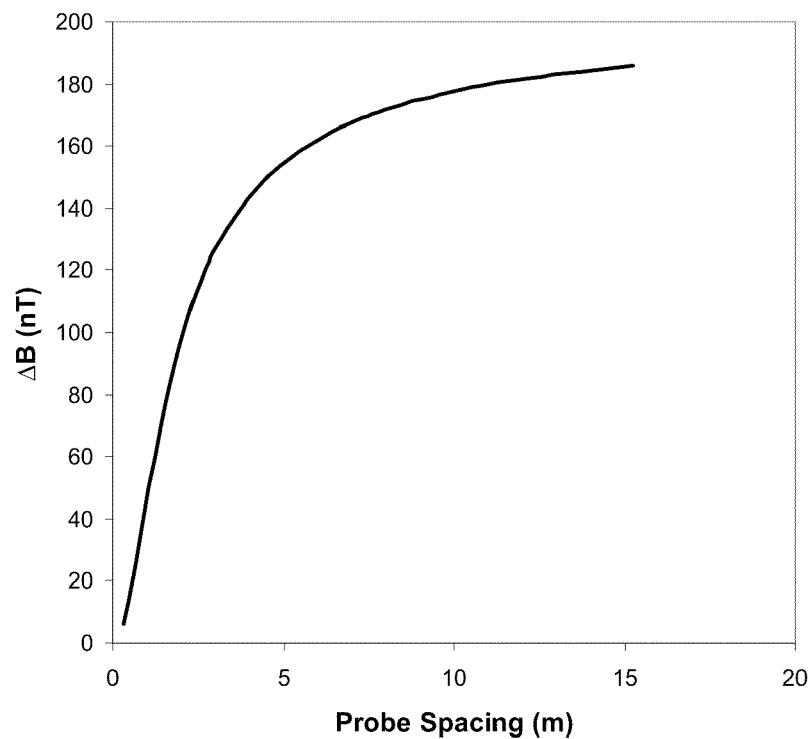
FIG. 4(a) and FIG. 4(b) are graphs of the change in magnetic field and ACVG with probe spacing, showing semblance of variations.
Figure 4B:
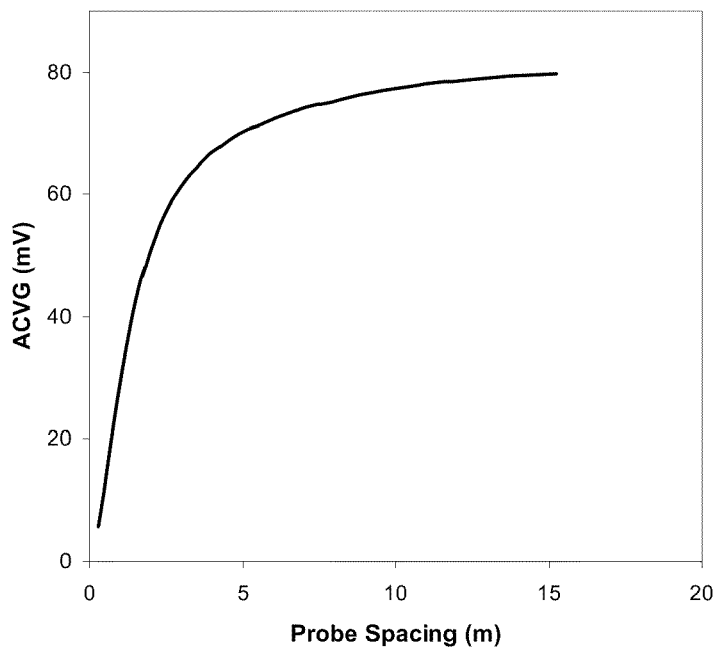

Taking the difference, we have:

$$B_0 - B_1 = k \cdot I \cdot \left(\frac{1}{r_0} - \frac{1}{r_1}\right) \quad (4)$$

$$\Delta B_{01} = k \cdot I \cdot \left(\frac{1}{r_0} - \frac{1}{r_1}\right)$$

where $\Delta B_{01}$ is the difference between the magnetic field strengths at the radial distances that coincide with the point of contacts of the voltage probes 9 and 10 with the ground 8. As the probe spacing (PS) between 9 and 10 is increased by moving 10 further from the axis of 4, $\Delta B_{01}$ increases until it reaches a plateau, as it were. This is illustrated in FIG. 4(a). For radial distances very close to the source of current, the change in magnetic field strength is very large since the field lines are strongest at these points. Further away from current source, the field strengths diminish. These difference are reflected in the sharp increase in $\Delta B_{01}$ initially, and then the plateau towards to end of the curve. Essentially, it shows the variation of $\Delta B_{01}$ with PS.

With each variation of PS, the voltage gradients are also measured. A typical field result is shown plotted in FIG. 4(b). Obviously, it has similar variation with PS as does the $\Delta B_{01}$. From this we conclude that the voltage gradient is directly proportional to the change in magnetic field strength. By extension, the mathematical expression is given as:

$$ACVG_{01} = K \cdot \Delta B_{01} = Kk \cdot I \cdot \left(\frac{1}{r_0} - \frac{1}{r_1}\right) = Q \cdot I \cdot \left(\frac{1}{r_0} - \frac{1}{r_1}\right) \quad (5)$$

where K is an intermediate constant of proportionality leading to the definition of the new term Q for normalizing the measured ACVG at a given location.

In Equation (5), Q (=K.k) is a new constant which depends on the relationship between the ACVG and the terms in the bracket. For simplicity, we have called the terms in the bracket Effective Probe Spacing (EPS). From one coating anomaly to another along the same pipeline survey, Q varies directly with coating anomaly size.

The general industry practice has been to simply log the ACVG at common probe spacing throughout the survey and then prioritize the coating anomalies based on the raw data.

However, similar size coating anomalies at varying pipe depths give differing voltage gradient results. The implication is a false impression of the true nature of the coating anomalies. Thus, Equation (5) presents a new method to determine the true voltage gradient at varying depths by normalizing (or standardizing) all voltage gradient data to a common EPS, and also to a common current level, I. When all voltage gradients are normalized to a common EPS, say the maximum values throughout the survey, $EPS_{max}$, the new protocol is defined by:

$$ACVG_{Norm} = \frac{EPS_{max}}{EPS_{measured}} * \frac{ACVG_{measured}}{I_{measured}} \qquad (6)$$

$I_{measured}$ and depth of cover may be determined simultaneously using known measurement devices, such as the SeekTech SR-20 produced by RIDGID Tool Company.

A second look at Equation (5) presents another methodology for prioritizing coating anomalies from voltage gradients. Rather than normalize all voltage gradient data to a common EPS and I, we could simply determine the Q values, since it varies directly with the voltage gradients. Q is derived by manipulating Equation (5) thus:

$$Q = \frac{ACVG_{01}}{I*EPS} \qquad (7)$$

The units of $ACVG_{Norm}$ and Q in Equations (6) and (7) are, respectively, Ω (Ohm) and Ω.m (Ohm*meter). This method normalizes all voltage gradients and gives a clear and true picture about where the greatest anomalies may be occurring, and quantifies them, irrespective of pipeline depth of burial (although the depth could be "too deep"; more on this later), probe spacing, and current level at the coating anomaly.

One step-by-step procedure for using the first approach defined by Equation (6) is summarized as follows:
1. based on standard probe spacing (SPS) if desired and a selected DOC (may be median depth of cover for the entire survey), calculate the standard EPS to be used for the normalization;
2. for every measured ACVG, calculate the corresponding EPS; and,
3. calculate the normalized ACVG that corresponds to the standard EPS using the linear estimation of Equation (6).

The procedure for using the Q factor of Equation (7) is similar save that EPS is not normalized to any standard value.

Off-Set Probe Spacing

Figure 5:
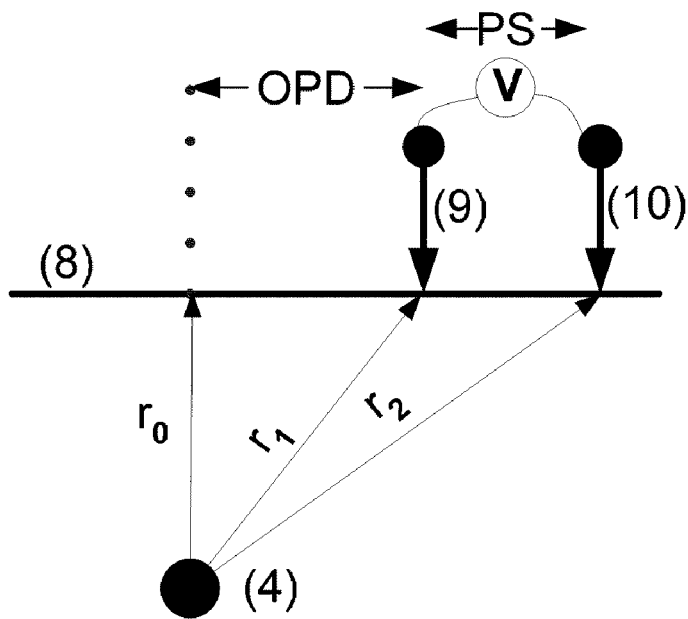
FIG. 5 illustrates a method for measuring ACVG when it is difficult to assess the top of the pipeline.

FIG. 5 is another variation of FIG. 3, and is the applicable procedure for measuring voltage gradients when it is either impossible to assess the top of the pipeline or too dangerous to do so. The method involves placing the first voltage probe some Off-set Probe Distance (OPD) from the axis of the pipeline, and the second probe PS distance from the first and orthogonal to it. The new methodology involves taking two consecutive readings of voltage gradients at varying OPD from the pipeline axis. For simplicity, the probe spacing, PS, between the two probes is kept constant during this procedure. Applying the method used earlier in Equation (5) to FIG. 5, we have:

$$ACVG_{12}=K.\Delta B_{12}=K.(\Delta B_{02}-\Delta B_{01}) \qquad (8)$$

Substituting for ΔB from earlier considerations (i.e. Equations (3) and (4)), we have:

$$ACVG_{12} = Kk \cdot I \cdot \left\{ \left(\frac{1}{r_0} - \frac{1}{r_2}\right) - \left(\frac{1}{r_0} - \frac{1}{r_1}\right) \right\} \qquad (9)$$
$$= Q \cdot I \cdot \left\{ \frac{r_2 - r_0}{r_2 r_0} - \frac{r_1 - r_0}{r_1 r_0} \right\}$$

The terms in the bracket in Equation (9), which represent a change in EPS, would be expressed as ΔEPS. In Equation (9) Q is a constant of proportionality which may be determined from the slope of the graph of ACVG vs. ΔEPS if several ACVG readings were taken and the off-set probe distances (OPD) increased accordingly.

A closer look at Equation (9) reveals that normalization of ACVG for zero off-set probe spacing would satisfy the condition that $r_1=r_0$. As $r_1 \to r_0$, OPD→0 and ΔEPS changes thus:

$$\Delta EPS = \frac{r_2 - r_0}{r_2 r_0} - \frac{r_1 - r_0}{r_1 r_0} \to \frac{r_2 - r_0}{r_2 r_0} - \frac{0}{r_1^2} \to \frac{r_2 - r_0}{r_2 r_0} \qquad (10)$$

Incorporating Equations (10) into (9):

$$ACVG_{NO\text{-}OFFSET} = Q \cdot I \cdot \left(\frac{r_2 - r_0}{r_2 r_0}\right). \qquad (11)$$

The use of Equation (11) to calculate the zero off-set ACVG is an exception to the rule. As $r_1 \to r_0$, and $r_2$ remains in its position, hypothetically, and $(r_2-r_0)$ becomes greater than standard EPS. This is not a concern since the calculated zero-offset ACVG would also be corrected to standard EPS, as shown in the calculation procedure below.

Since the graph of ACVG vs. ΔEPS gives a linear model based on Equation (9), the slope of that plot is used to determine the zero off-set ACVG via extrapolation. Emphasis is placed on "extrapolation" because ACVG increases with proximity to the pipeline axis, which is closer to the epicenter of the coating anomaly as opposed to off-set distances. The method for doing this is described below:
1. Measure two off-set probe spacing ACVGs ($ACVG_{12}$ and $ACVG_{13}$) and off-set distances from the pipeline axis. Normalization accuracy is enhanced when equal probe spacing is used for both data;
2. Using Equation (9) as guide, ΔEPS is calculated for each off-set position, and a slope of ACVG vs. ΔEPS is determined;
3. Finally, Equation (11) is invoked, and a non-offset ACVG is calculated that corresponds to $$EPS = \frac{r_2 - r_0}{r_2 r_0}.$$

This is essentially an extrapolation process since this new ACVG should be greater than the off-set ACVGs. Since the values of $r_2$ and $r_0$ are known a priori from the first off-set location, we simply calculate the new EPS using these numbers, and apply linear approximation and extrapolation as follows:

$$ACVG_{NO\text{-}OFFSET} = \left(\frac{ACVG_{12} - ACVG_{23}}{\Delta EPS_{12} - \Delta EPS_{23}}\right) \cdot \left(\frac{r_2 - r_0}{r_2 r_0}\right) + ACVG_{12}; \quad (12)$$

4. $ACVG_{NO\text{-}OFFSET}$ is now normalized to standard EPS for the survey using Equation (6).

Unusually Deep Depth of Cover (DOC)

When the pipeline is buried too deep at certain locations, it is possible to survey past ACVG anomaly unnoticed, especially when the anomaly is not a very large one. This situation requires a proactive solution, wherein the current DOC dictates what adjustments are required for the probe spacing. The objective of this is to adopt higher-than-normal probe spacing for measuring the ACVG. This is important because ACVG measurement sensitivity diminishes with pipeline depth of burial, and the only method of improving the sensitivity is to increase the probe spacing. In particular, this method uses the fact that ACVG is directly proportional to EPS, which is directly proportional to the probe spacing, for a given depth. Thus, the proactive solution determines a new EPS that would correspond to a higher ACVG. Once measured, it may then be normalized for the standard effective probe spacing, EPS.

Figure 6:
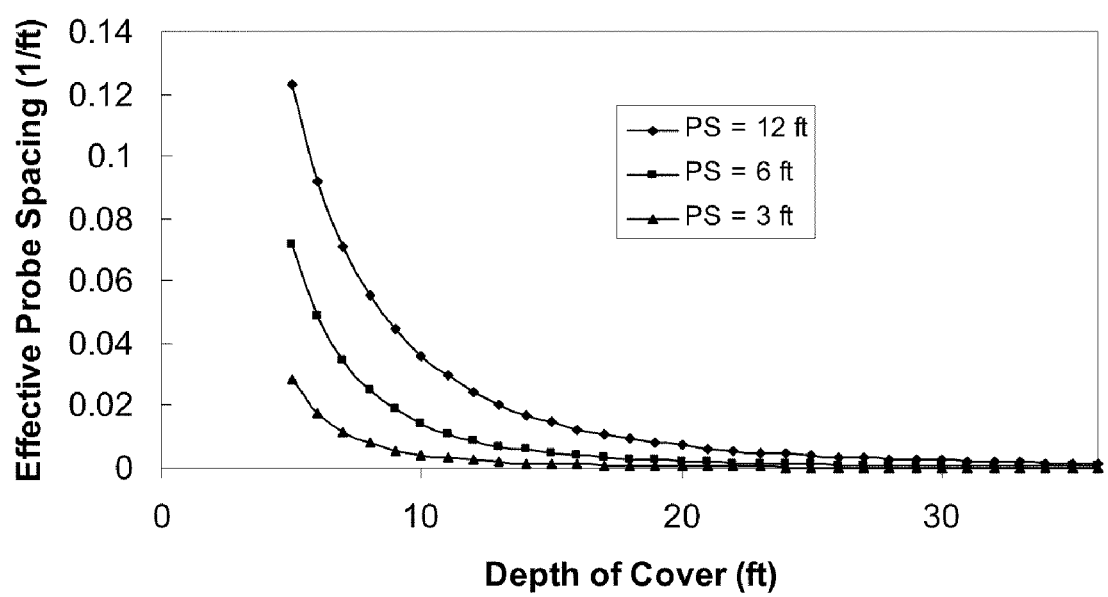
FIG. 6 is a graph of effective probe spacing vs. depth of cover (DOC).

FIG. 6 is a simple demonstration of the possible indirect effect on the ACVG of deep depth of cover via EPS. It is generated by varying the depth of cover from 5 ft to 50 ft, while the probe spacing is maintained at 3, 6 and 12 ft respectively. Since the effective probe spacing has a direct proportionality relationship with the ACVG, whereas it has inverse relationship with the DOC, it is easy to conclude—without any loss of generalization—that ACVG is inversely proportional to the DOC via the EPS. That is, as DOC tends to "infinity" (DOC→∞), EPS tends to zero (EPS→0); therefore, ACVG also tends to zero. Thus, as the DOC increases "infinitely", the measured ACVG apparently becomes more and more insignificant (due to exponential decline of the EPS). FIG. 6, which also has the similitude of magnetic field variation with distance from source, gives the range of variations we can use to set a standard—albeit theoretically—for optimum DOC beyond which adjustment might be necessary for the probe spacing in order to increase the numerical value of the EPS.

An analysis of the slope of the curves at each DOC, presented in Table 1, was used to investigate the depth at which the EPS variation becomes zero, evaluated to 4 decimal places. From foregoing discussions, the trend here is similar to that which the voltage gradients are expected to follow. That is, for a probe spacing of 3 ft, ACVG sensitivity decreases appreciably when the DOC=24 ft and beyond. Thus, as the DOC increases beyond the values calculated here, the only guarantee of being able to capture the voltage gradient readings is to increase the probe spacing, which gives higher EPS and higher ACVG sensitivity.

TABLE 1

Numerical data showing the DOC at which EPS, and by extension, voltage gradient, sensitivity decreases to zero

| Probe Spacing, PS (ft) | DOC (ft) at which $\Delta EPS = 0$ |
| --- | --- |
| 3 | 24 |
| 6 | 33 |
| 12 | 46 |

The new methodology to log the ACVG for unusually deep DOC entails calculating the probe spacing for a higher EPS. For instance, at probe spacing=3 ft, and DOC=30 ft, EPS=0 $m^{-1}$. Since the pipe DOC cannot be changed, the only parameter we can change is the EPS via the probe spacing. Thus, for a new EPS increase which equals 0.002 $m^{-1}$, a recalculated probe spacing=10.89 ft. This value results in a new, "measurable" ACVG.

While the foregoing applies in general to all voltage gradient readings, the higher the coating anomaly, the less is the effect of deep DOC on the ACVG sensitivity. That is, there is no general rule that stipulates the magnitude of voltage gradient at which the condition given in Table 1 renders the ACVG at such depth and probe spacing "indeterminate". But the application of the suggested technique does indeed enhance data accuracy and measurement sensitivity, irrespective of the magnitude of the ACVG anomaly.

In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be one and only one of the elements.

The following claims are to be understood to include what is specifically illustrated and described above, what is conceptually equivalent, and what can be obviously substituted. Those skilled in the art will appreciate that various adaptations and modifications of the described embodiments can be configured without departing from the scope of the claims. The illustrated embodiments have been set forth only as examples and should not be taken as limiting the invention. It is to be understood that, within the scope of the following claims, the invention may be practiced other than as specifically illustrated and described.

What is claimed is:

1. A method of prioritizing anomalies in a linear conductor buried under a ground surface, comprising the steps of:
    obtaining prioritization values for a plurality of anomalies along a linear conductor, wherein, for each anomaly, a prioritization value is obtained using a method comprising the steps of:
    locating an anomaly;
    determining a current along the linear conductor at the anomaly, a depth of cover of the linear conductor, and a voltage gradient, the voltage gradient being determined using a first voltage probe at a first position and a second voltage probe at a second position, the first and second voltage probes taking a voltage reading and being separated by a probe spacing;
    using the depth of cover and the voltage gradient, calculating an effective probe spacing of the first and second voltage probes relative to the anomaly on the conductor; and
    determining the prioritization value of the anomaly based on a linear relationship between the voltage gradient and the product of the current and the effective probe spacing; and
    ranking the prioritization values according to magnitude.

2. The method of claim 1, wherein determining the current and the depth of cover comprises using a measurement device.

3. The method of claim 2, wherein the probe spacing is constant for each anomaly.

4. The method of claim 1, wherein the first position is at a point directly above an anomaly of the linear conductor being measured, and the second position is spaced from the first position in a direction parallel to or perpendicular to the linear conductor.

5. The method of claim 1, wherein each of the first position and the second position are offset from a point on the ground surface directly above an anomaly being measured, the first probe and the second probe being spaced from the anomaly along a line perpendicular to the linear conductor.

* * * * *